US009526193B2

(12) United States Patent
Demange et al.

(10) Patent No.: US 9,526,193 B2
(45) Date of Patent: Dec. 20, 2016

(54) INFORMATION TECHNOLOGY APPARATUS AND ASSOCIATED TRANSPORTABLE INFORMATION TECHNOLOGY HOSTING CENTER

(75) Inventors: Fabien Demange, Poissy (FR); Nicolas Depret, Chaville (FR)

(73) Assignee: BULL SAS, Les Clayes Sous Bios (FR)

(*) Notice: Subject to any disclaimer, the term of this patent is extended or adjusted under 35 U.S.C. 154(b) by 0 days.

(21) Appl. No.: 13/637,633

(22) PCT Filed: Mar. 22, 2011

(86) PCT No.: PCT/FR2011/050583
§ 371 (c)(1),
(2), (4) Date: Sep. 26, 2012

(87) PCT Pub. No.: WO2011/117527
PCT Pub. Date: Sep. 29, 2011

(65) Prior Publication Data
US 2013/0021733 A1    Jan. 24, 2013

(30) Foreign Application Priority Data
Mar. 26, 2010  (FR) .................................. 10 52238

(51) Int. Cl.
F16M 13/00     (2006.01)
H05K 7/20      (2006.01)
(52) U.S. Cl.
CPC ................... *H05K 7/2079* (2013.01)
(58) Field of Classification Search
CPC ............ F16F 15/02; F16F 15/04; F16F 15/06; F16F 15/067; F16F 15/08; B63B 25/24; B63B 25/22; H02K 5/24; B65D 2585/30; B65D 85/307; B65D 19/0024; B65D 81/107; B65D 19/40

USPC ............................... 248/618, 638; 312/223.2
See application file for complete search history.

(56) References Cited

U.S. PATENT DOCUMENTS 4,153,225 A * 5/1979 Paulsen .............. H05K 7/20572
244/118.1
4,190,227 A * 2/1980 Belfield .................... F16F 7/14
248/618
4,877,136 A * 10/1989 Mizuno .................. B65D 81/07
206/521

(Continued)

FOREIGN PATENT DOCUMENTS

EP     0 692 431 A1    1/1996
EP     1 188 678 A1    3/2002

OTHER PUBLICATIONS

International Search Report for PCT/FR2011/050583, mailed Jul. 15, 2011.

*Primary Examiner* — Christopher E Garft
(74) *Attorney, Agent, or Firm* — Pillsbury Winthrop Shaw Pittman LLP

(57) ABSTRACT

The invention particularly relates to a computer device (700) for a computer housing center that is transportable in a container. The computer device includes at least one computer cabinet. Said computer device is sized and arranged so as to be movable inside a container into which said computer device is to be placed, and which comprises an absorber system that is suitable, with regard to said computer device, for absorbing the transmission of vibrations to the at least one computer cabinet once the computer device is installed in the container.

25 Claims, 12 Drawing Sheets

(56) References Cited

U.S. PATENT DOCUMENTS

| | | | | |
|---|---|---|---|---|
| 5,195,439 | A * | 3/1993 | Harder | B65D 19/0026 |
| | | | | 108/57.12 |
| 5,970,886 | A * | 10/1999 | Knio | B65D 19/38 |
| | | | | 108/57.12 |
| 6,530,563 | B1 * | 3/2003 | Miller | F16F 7/14 |
| | | | | 188/378 |
| 7,551,971 | B2 * | 6/2009 | Hillis | H05K 7/1497 |
| | | | | 267/140.11 |
| 7,856,838 | B2 * | 12/2010 | Hillis | H01L 23/467 |
| | | | | 312/223.2 |
| 2002/0162937 | A1 * | 11/2002 | Sebert | H04R 1/026 |
| | | | | 248/618 |
| 2003/0016493 | A1 * | 1/2003 | Hiratomo | G06F 1/181 |
| | | | | 361/679.36 |
| 2003/0226949 | A1 * | 12/2003 | Cain | H05K 7/1495 |
| | | | | 248/603 |
| 2007/0283858 | A1 * | 12/2007 | Ballard | B65D 19/0016 |
| | | | | 108/57.12 |
| 2008/0123288 | A1 * | 5/2008 | Hillis | H05K 7/20745 |
| | | | | 361/679.34 |
| 2009/0000526 | A1 * | 1/2009 | Looker | B65D 88/12 |
| | | | | 108/57.12 |
| 2011/0068548 | A1 * | 3/2011 | Houggard | B65D 85/68 |
| | | | | 280/43.17 |

* cited by examiner

INFORMATION TECHNOLOGY APPARATUS AND ASSOCIATED TRANSPORTABLE INFORMATION TECHNOLOGY HOSTING CENTER

CROSS-REFERENCE TO RELATED APPLICATIONS

This application is a U.S. National Phase under 35 U.S.C. §371 of International Application PCT/FR2011/050583, filed Mar. 22, 2011, which designated the U.S., and which claims priority under 35 U.S.C. §119 to French Patent Application Number 1052238, filed on Mar. 26, 2010. The disclosures of the above-described applications are hereby expressly incorporated by reference in their entireties.

The present invention relates to an IT apparatus (IT standing for information technology) for a transportable IT hosting center of a type with simplified installation and uninstallation and a container for a transportable IT hosting center comprising such an IT apparatus.

IT hosting centers, also known as data centers or server clusters are sets grouping together in particular servers, data storage units or telematic equipment taking the form of racks in which the electronic devices are installed.

Typically, such centers incorporate in particular elements for control and security, an air conditioning system, anti-fire devices and elements for maintenance and monitoring. They require an electrical supply and connections to networks of Internet or Ethernet type (Ethernet being a trademark) as well as, generally a water supply for cooling.

Some hosting centers able to be installed and uninstalled on request take the form of prefabricated elements of freight container type, which may meet standards for transport by truck or ship, and which incorporate the different hardware elements mentioned above in a form more or less integrated and ready for use.

It may be noted that needs for computing centers also appear in highly constrained spaces, such as off-shore spaces.

Whether it be because they are installed in such constrained spaces or because they are transported by truck or ship, it is found that the IT apparatuses suffer from shocks or vibrations.

Furthermore, the needs of users in terms of computing power vary strongly, sometimes on the increase, sometimes on the decrease, and it is apparent that the current systems have insufficient flexibility to deal with the necessary adjustments rapidly while controlling costs.

In this context, the problem arising is to provide an IT apparatus for a transportable IT hosting center combining mechanical security for the IT apparatuses and flexibility in terms of capability provided.

To that end, there is provided an IT apparatus to constitute IT hosting centers that are transportable by container, the IT apparatus comprising at least one IT rack, characterized in that the IT apparatus is dimensioned and arranged to be movable in a container for it to be put into place and in that it further comprises a shock-absorbing system to damp the transmission of vibrations to the at least one IT rack, in particular when the IT apparatus is installed in the container.

By virtue of such an IT apparatus, a hosting center can be constituted in one or more containers by installing in one or more containers, which may initially be empty, an adapted number of IT apparatuses, which may range from one to five IT apparatuses, or even more depending on the size of the container. The IT apparatuses are easily movable by human operators with a light goods handling apparatus and each of the IT apparatuses have their own shock-absorbing system, which ensures their protection, in particular when the hosting center is completed. The vibrations concerned may be vertical vibrations or other vibrations.

According to an advantageous feature, the IT apparatus comprises an accessible continuous or discontinuous handling surface, for example defined by two horizontal beams disposed under the at least one IT rack. Thus, the IT apparatus may be moved by a pallet conveying apparatus, commonly called a "pallet jack".

According to an advantageous feature, the shock-absorbing system comprises at least three shock-absorbing units, which are disposed at three non-aligned points at least. The shock-absorbing thus takes place in a support or suspension plane of the equipment.

According to a feature, the IT apparatus comprises at least two IT racks, which may be similar or dissimilar to each other, disposed in the form of a row of IT racks extending horizontally.

The IT racks may be fastened together at least by the top or by the bottom.

The IT apparatus may further comprise a horizontal beam to which the IT rack or racks, as well as at least one shock-absorbing unit, are fastened for example rigidly.

This feature enables standard IT racks to be used and to link a row of IT racks to one or more shock-absorbing units easily.

The shock-absorbing system may comprise at least one shock-absorbing unit constituted by a cable wound in coils, the axis of the coils being horizontal. The shock-absorbing system may also comprise a block of flexible material, for example a block of rubber. Such a system gives non-linear damping.

According to an embodiment, the shock-absorbing system may comprise at least one support member adapted to be disposed on a member that is liable to vibrate, in particular vertically, such that the at least one IT rack rests on the member liable to vibrate via the shock-absorbing system.

According to another embodiment, the shock-absorbing system comprises at least one suspension member adapted to be suspended from a member that is liable to vibrate, in particular vertically, such that the at least one IT rack is suspended from the member liable to vibrate via the shock-absorbing system.

The invention also relates to a container for a transportable IT hosting center, comprising at least one IT apparatus as presented above.

The container may further comprise an access deck in front of a door of the at least one IT rack, preferably without rigid fastening linking it to the IT apparatus.

This access deck enables for example a human operator to move next to the IT apparatus, to stand upright in front of a door of the at least one IT rack and to access the content of the IT rack easily, at the proper height. This deck also enables the installation of hydraulic pipes and electric cables in the container, in particular within the hollow thickness of the deck, those pipes and cables being in this way easily connected to the lower part of the IT racks.

The access deck may be rigidly fastened to a wall of the container, for example the bottom wall, for example with bolts.

Such a fastening mode has the advantage of simplicity and enables available parts to be used without requiring adaptation.

The container may comprise a second similar IT apparatus, the shock-absorbing systems of the two IT apparatuses being independent.

The container may further comprise a cable linking said IT apparatus to a wall of the container to retain the apparatus in case of a high frontal shock.

The invention will now be described with reference to the accompanying drawings.

FIG. 1 presents a first shock-absorbing device according to the invention, viewed in perspective, FIGS. 2 to 4 present the same shock-absorbing device as that presented in FIG. 1, viewed from the side, from the three spatial directions.

FIGS. 5 and 6 present, from different angles, a step of assembling a set of IT racks on a shock-absorbing device as presented in FIGS. 1 to 4.

FIGS. 7 to 9 present an IT apparatus constituted by a set of IT racks, assembled on a shock-absorbing device such as presented on the preceding Figures.

FIG. 10 presents a container for a portable IT hosting center comprising two IT apparatuses as presented in FIGS. 7 to 9.

Figure 1:
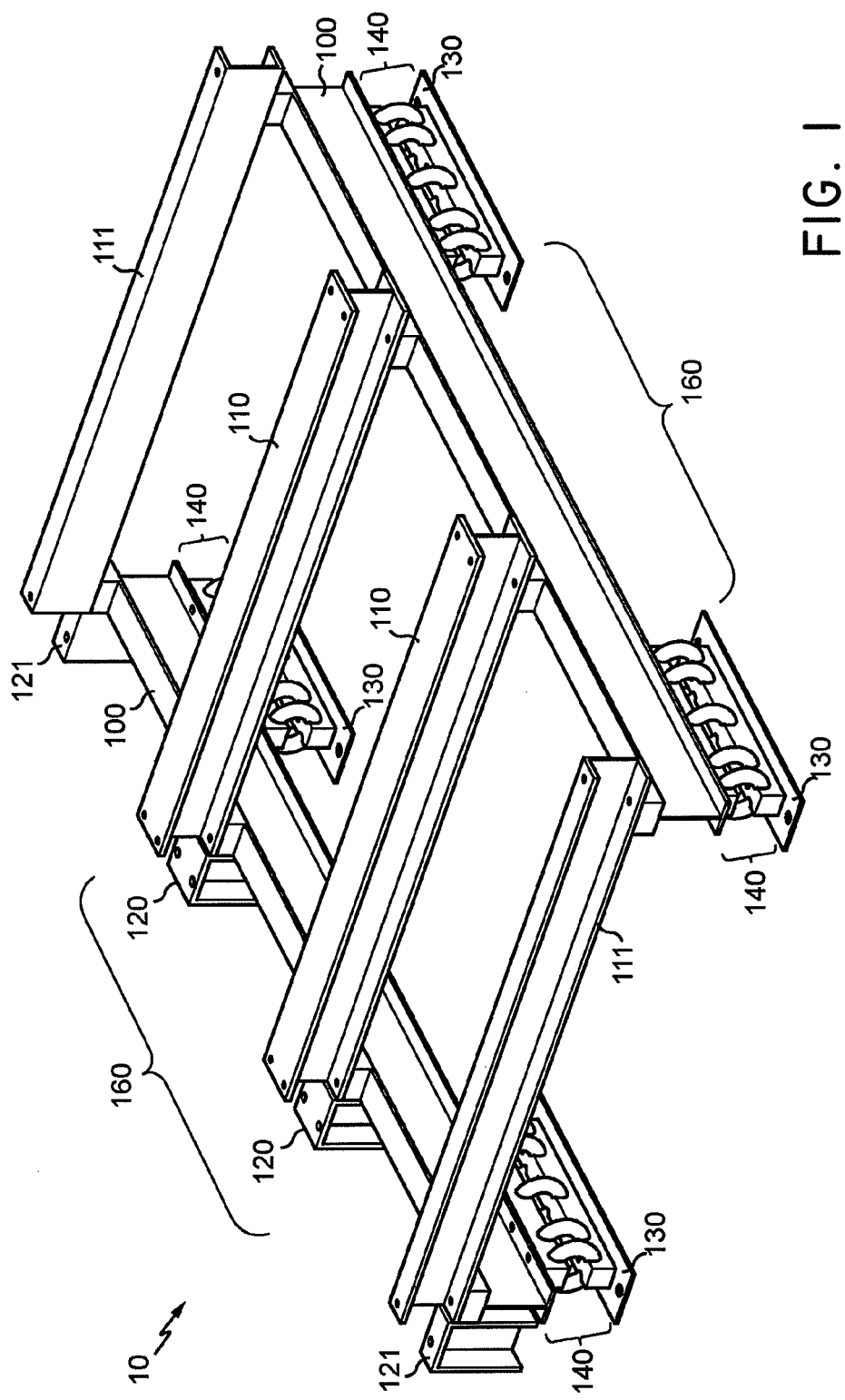

A shock-absorbing device 10 is presented in FIG. 1. This comprises two longitudinal beams 100. These are IPN beams (that is to say I-beams in conformity with a standard). Both beams are, for example, of size 120 mm×64 mm.

Transversely to these two longitudinal beams 100, two transverse beams 110 are presented here, referred to as intermediate transverse beams since they divide the beams 100 into approximately three sections of one third. These beams are also IPN beams, for example of dimension 100 mm×100 mm.

Transversely to the beams 100, there are also presented here two transverse beams 111, referred to as end transverse beams, since they intersect the beams 100 at their ends. The four transverse beams 110 and 111 define three rectangular sections with the longitudinal beams 100, each of the rectangular sections having transverse beams 110 and 111 as their long sides, and the three rectangular sections together forming a rectangle whose long sides are constituted by the longitudinal beams 100.

The transverse beams 110 and 111 are rigidly fastened to the face of the beams 100 that is disposed upwardly, which is designated upper face.

It should be noted here that other arrangements of beams may be implemented.

On the other face of the beams 100, designated lower face, there are fastened four shock-absorbing units, which here are shock-absorbers of Vibcable type (Vibcable is a trademark), referenced 140. According to this example, each shock-absorbing unit is constituted by a cable wound between longitudinal bars. The shock-absorbing units are fastened to the longitudinal beams 100, for example by bolts. Each shock-absorbing unit is positioned at one of the ends of the longitudinal beams 100. The shock-absorbing units thus form a rectangle. Alternatively, three shock-absorbing units disposed at three non-aligned points may be used. In a further alternative, more than four shock-absorbing units may be used.

It is observed here that other types of shock-absorbing units may be used. By way of illustration, as described with reference to FIG. 11, the shock-absorbing system may comprise a block of flexible material, for example a block of rubber, also known by the name Silentbloc (Silentbloc is a trademark). The shock-absorbing system may also comprise shock-absorbing units of different types.

At the remote opposite from the beams 100, the shock-absorbing units bear a plate 130, which is parallel to the faces of the beams 100 and which forms a lower fastening for the shock-absorbing device 10.

On the lower faces of each of the longitudinal beams 100, between the two shock-absorbing units present at the ends, is located a handling surface 160 constituted by a section of the surface of the beam. The empty space between the shock-absorbing units may serve for the insertion of the forks of a pallet jack (not shown), from one of the sides of the shock-absorbing device 10 or from the other side of the device. The handling surface then serves to raise the device upwardly, for it to be transported. It is observed that according to another embodiment, the shock-absorbing units are arranged differently in order for the handling surface to be linked to the beams 110 and 111 via the shock-absorbing units. Thus, the vibrations generated by a handling apparatus during the conveying of the shock-absorbing device are damped in relation to the beams 110 and 111.

Lastly, one of the sides of the shock-absorbing device 10 here bears four added-on parts referenced 120 and 121, which are fastened to the external side of one of the longitudinal beams 100 in the same plane, respectively, as the transverse beams 110 or 111. The function of these added-on parts will be described later.

Figure 2:
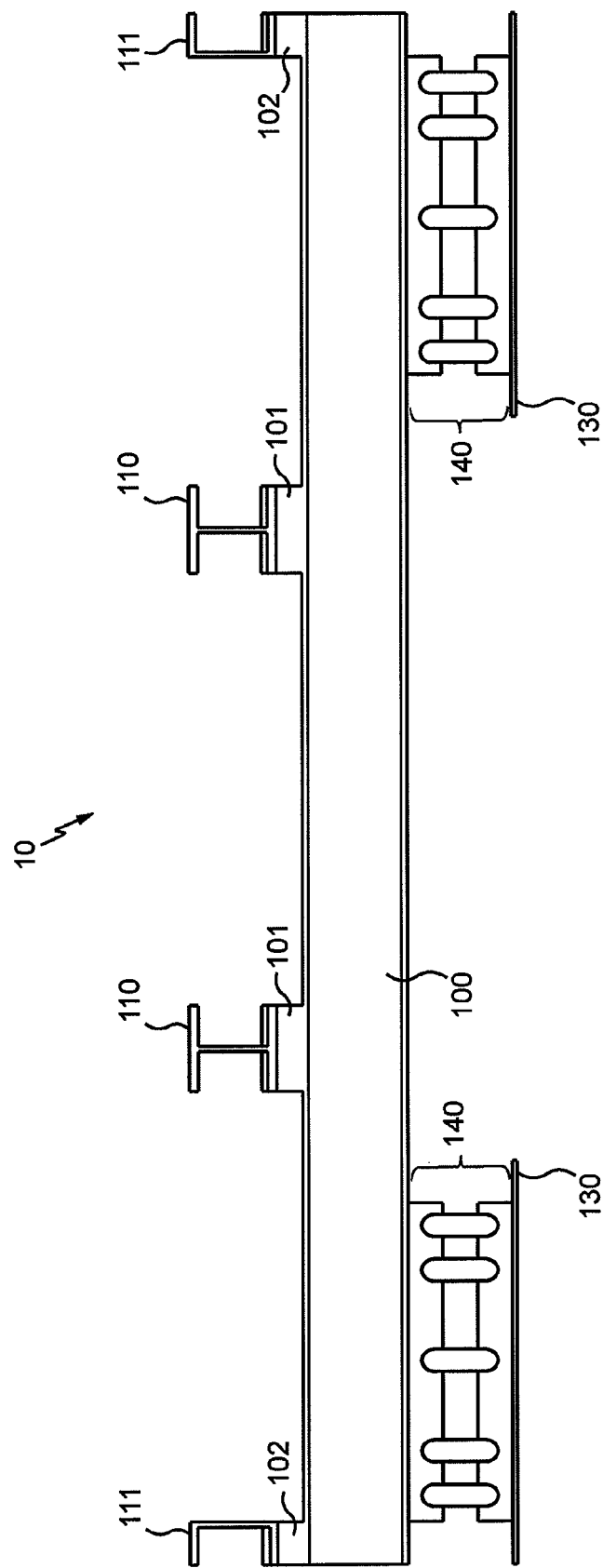

FIG. 2 represents a side view of same shock-absorbing device 10, from the right in FIG. 1. It is observed here that the transverse beams 110 and 111 are fastened to the beam 100 via spacers, respectively referenced 101 and 102.

Figure 3:
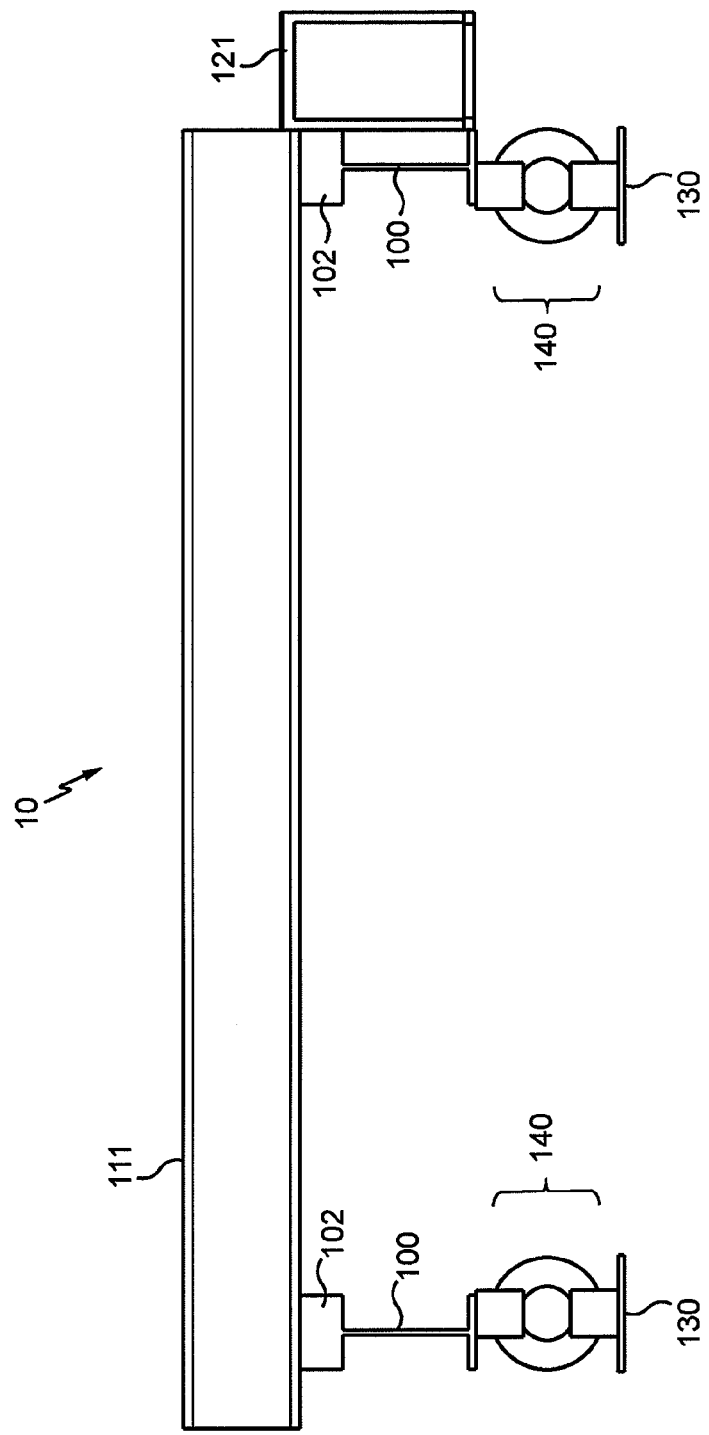

FIG. 3 represents a side view of same shock-absorbing device 10, from bottom right in FIG. 1. The spacers 102 can again be seen as well as the added-on part 121, referred to as end added-on part.

Figure 4:
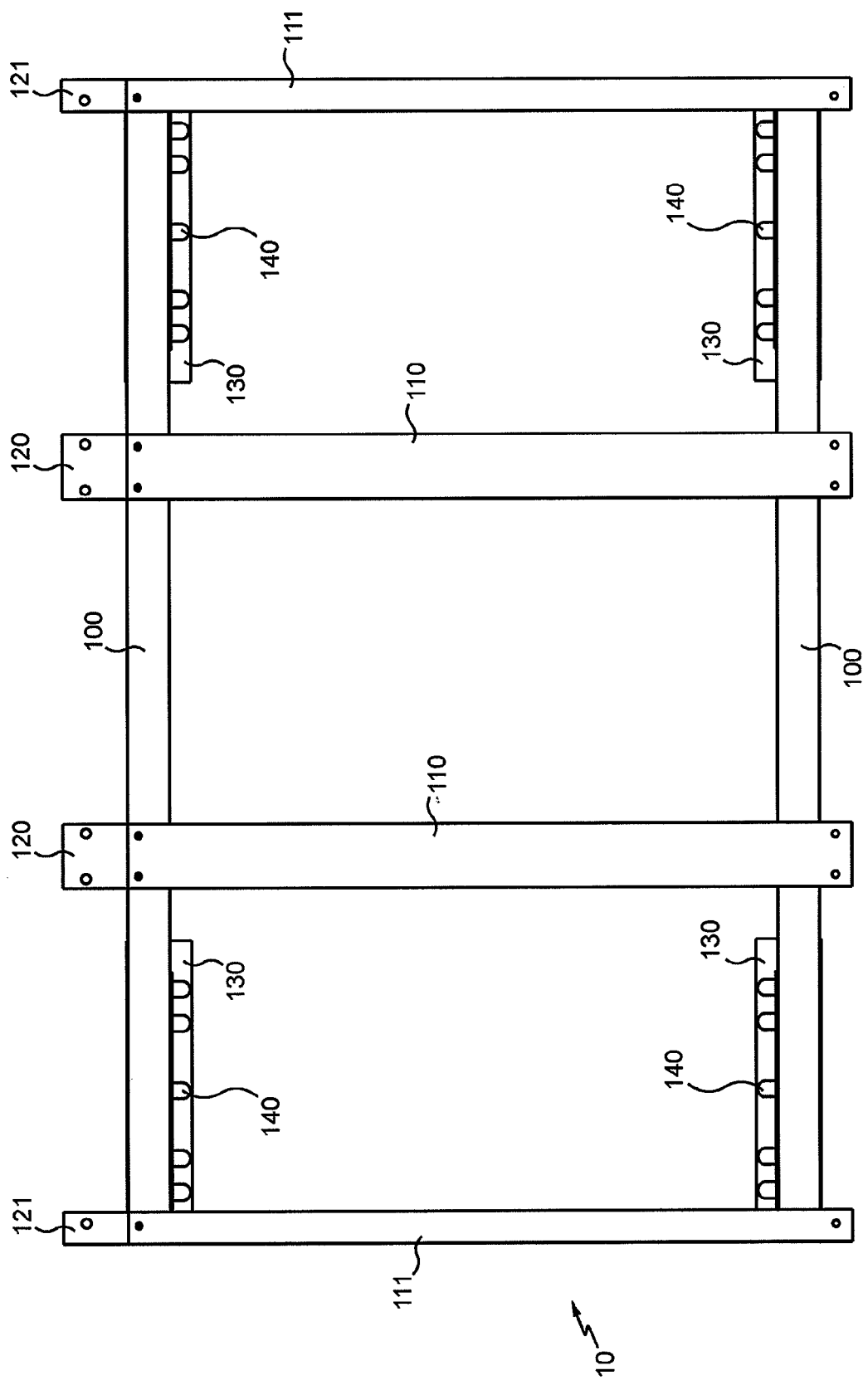

In FIG. 4, the same shock-absorbing device 10 has been represented, seen here from above, where the shock-absorbing units 140 are visible only partially. It is observed that the transverse beams 110 and 111 have their ends, on the same side as the added-on parts 120 and 121, aligned with the edge of the corresponding longitudinal beam 100. However, on the same side as the longitudinal beam 100 not bearing the added-on parts 120 and 121, the transverse beams 110 and 111 jut slightly beyond the edge of the longitudinal beam 100.

Figure 5:
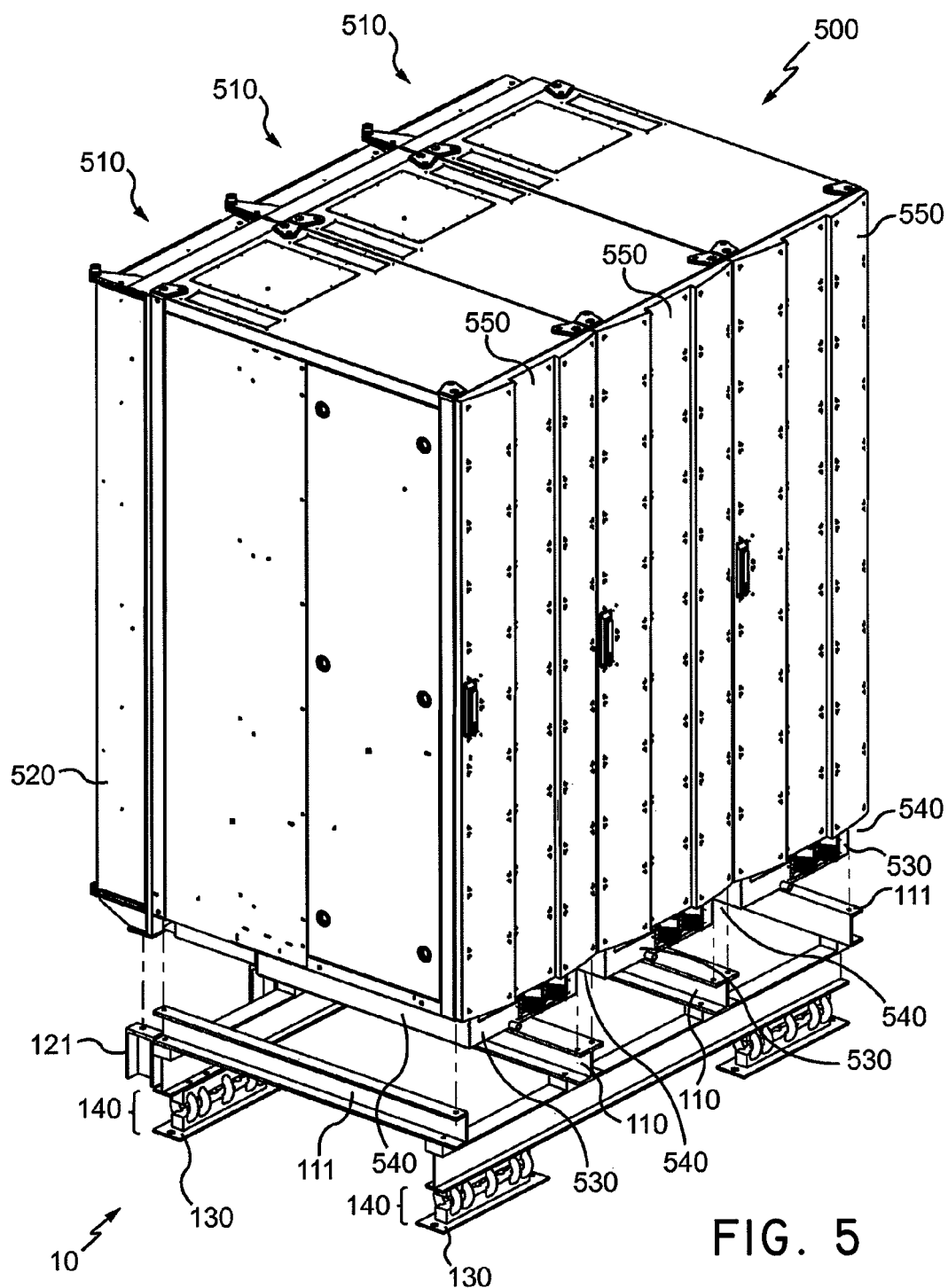

In FIG. 5, a row 500 of three IT racks 510 is represented, during its fastening to a shock-absorbing device 10 as presented in the preceding Figures. The three IT racks 510 represented are side by side, their main doors 550 being disposed on the same side of the row 500 (to the right in FIG. 5). According to this example, the IT racks 510 also each posses a cooling system included in the thickness of a secondary door 520, designated "cold door", which is situated on the opposite face to the main door 550.

The bottom of each of the IT racks 510 here comprises a zone that is slightly narrower than the rest of the IT rack referred to as lower part 530. The empty zone surrounding the lower part 530 in line with the IT rack 510 constitutes a space, here designated fastening space 540.

During the step of fastening the row 500 of IT racks 510 to the shock-absorbing device 10, the transverse beams 110 and 111 are positioned in the fastening spaces 540. Thus the end transverse beams 111 come to be positioned at the location of the fastening spaces 540 at the ends of the row 500 whereas the intermediate transverse beams 110 come to be positioned in the double fastening space 540 located between the lower parts 530 of two consecutive IT racks 510 of the row 500. It is observed here that the dimensions of the beams 110 and 111 are adapted for insertion in the fastening spaces 540. All these members are rigidly fastened using, for example, bolts. The lower part of the door frame of the secondary door 520 furthermore comes to be positioned in contact with the added-on parts 120 and 121. The bolt fastening is represented in the Figure, at the ends of the beams 111, 110 and at the added-on part 121.

The lower parts 530 of each of the IT racks 510 are thus located between two successive transverse beams 110 or 111 of the shock-absorbing device 10.

Figure 6:
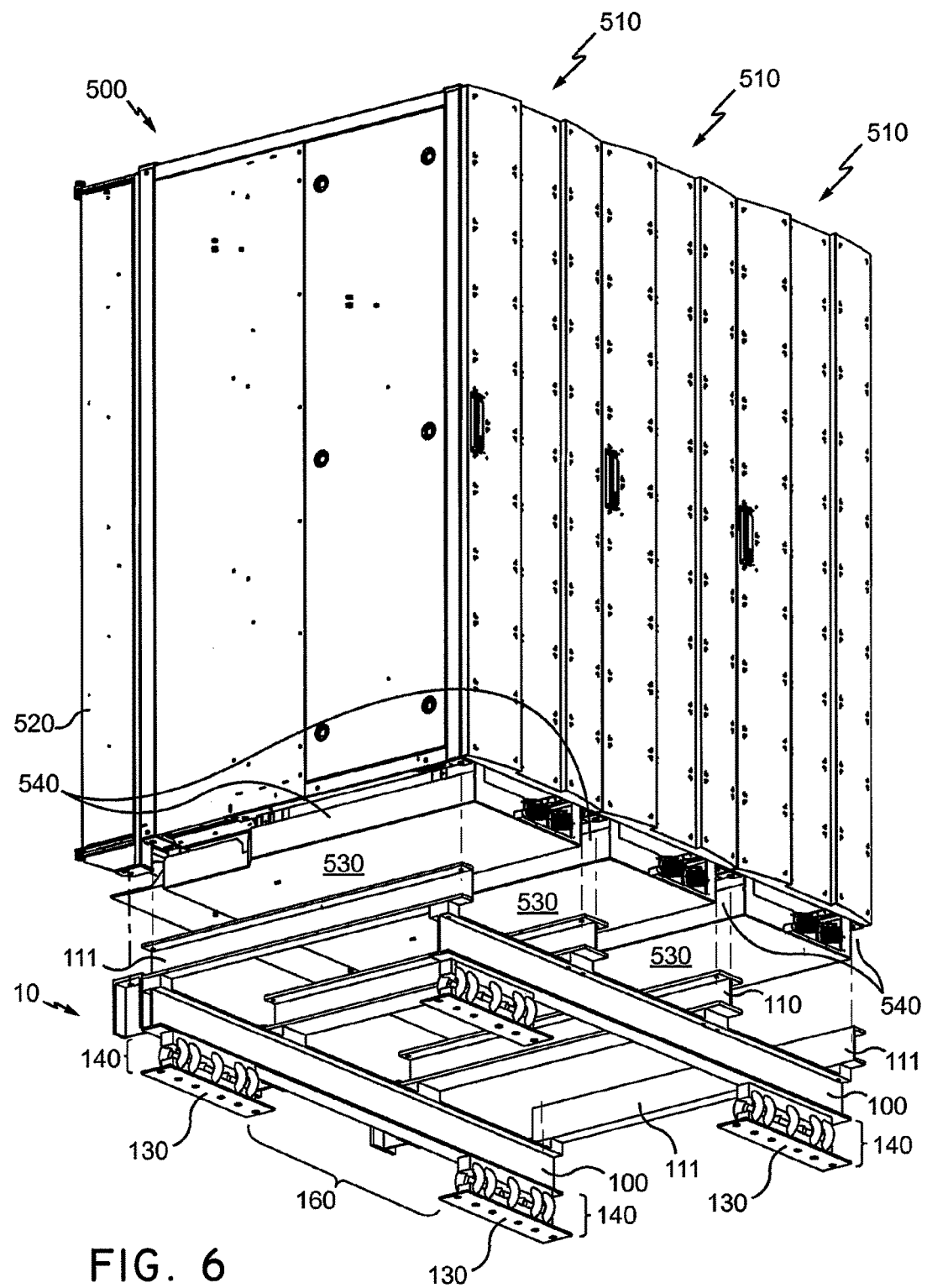

FIG. 6 represents the same step of fastening the row 500 of IT racks 510 onto the shock-absorbing device 10. The complementary arrangement and shapes of the transverse beams 110 and 111 in relation to the lower parts 530 and fastening spaces 540 of the row 500 can also be observed.

Also represented in this view is the handling surface 160 constituted by the lower part of the longitudinal beams 100 between the shock-absorbing units 140.

Figure 7:
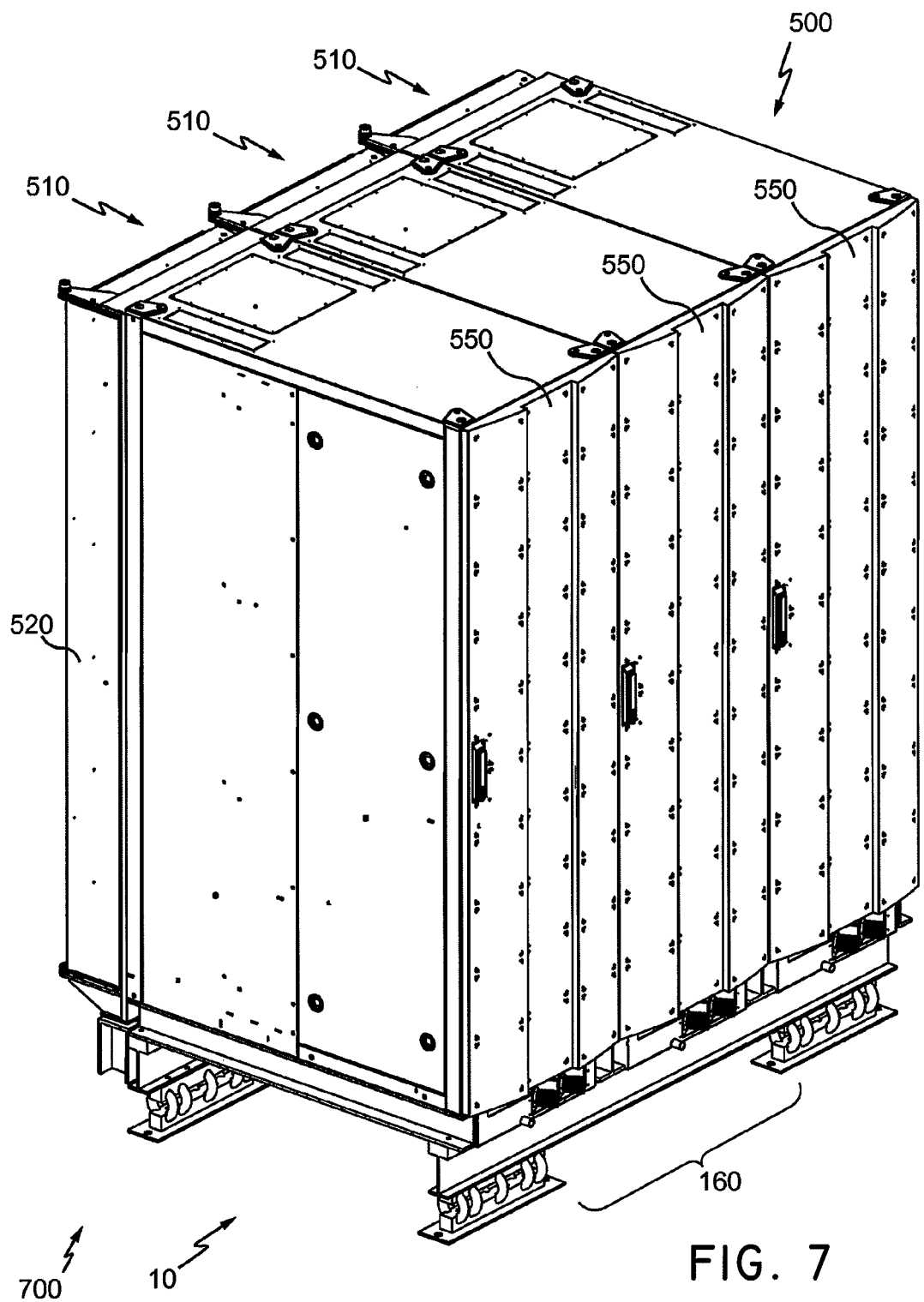

In FIG. 7 is represented the IT apparatus 700 resulting from the fastening of the row 500 onto the shock-absorbing device 10. The three IT racks 510 can be recognized as well as the handling surface 160.

Figure 8:
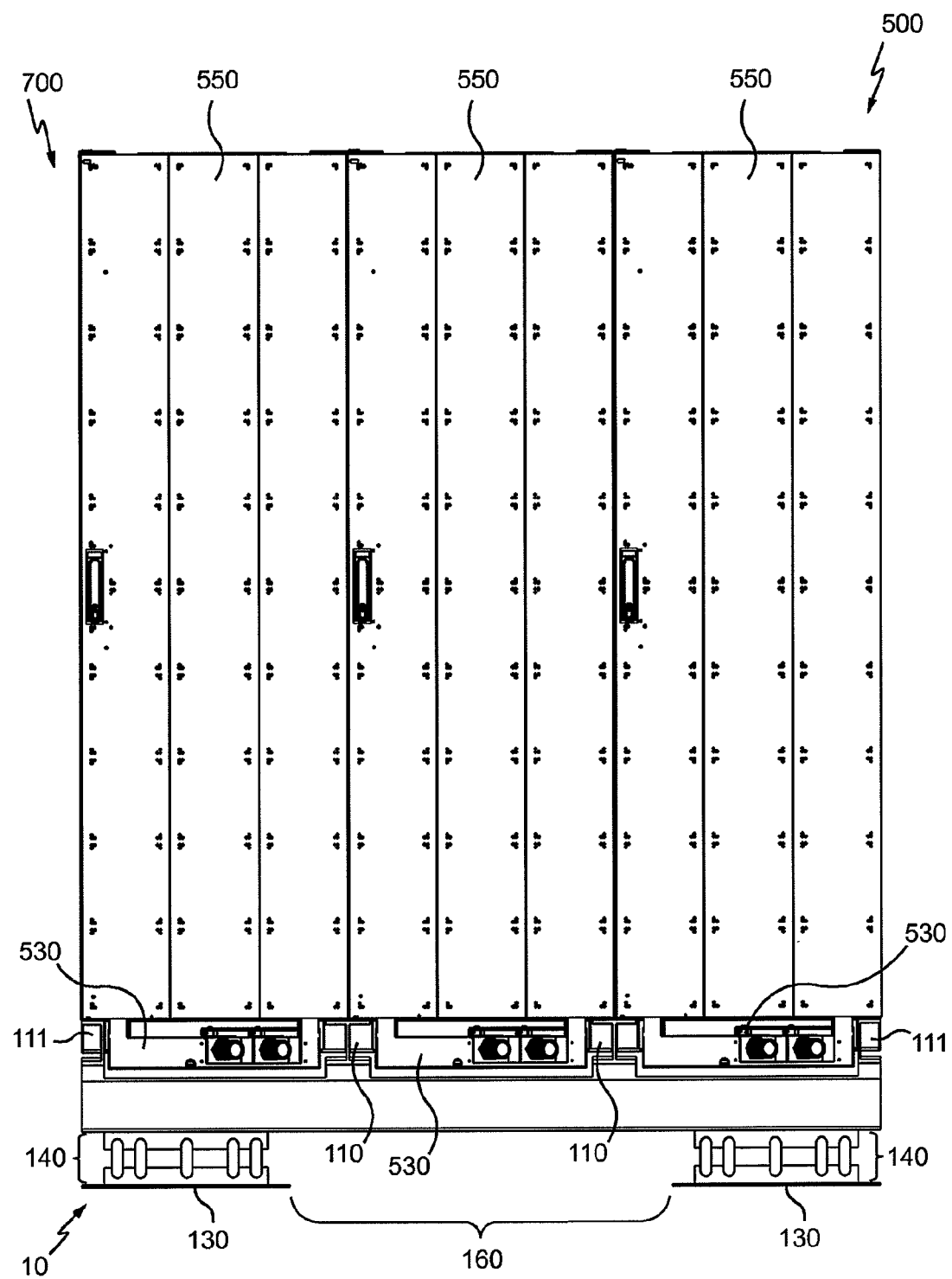

FIG. 8 represents a side view of the same IT apparatus 700, from the right in FIG. 7. The main doors 550 in particular can be recognized. The complementary arrangement and shape of the transverse beams 110 and 111 in relation to the lower parts 530 of the IT racks of the row 500 can also be observed. The handling surface 160 is also represented as well as the fastening plates 130 of the shock-absorbing units.

Figure 9:
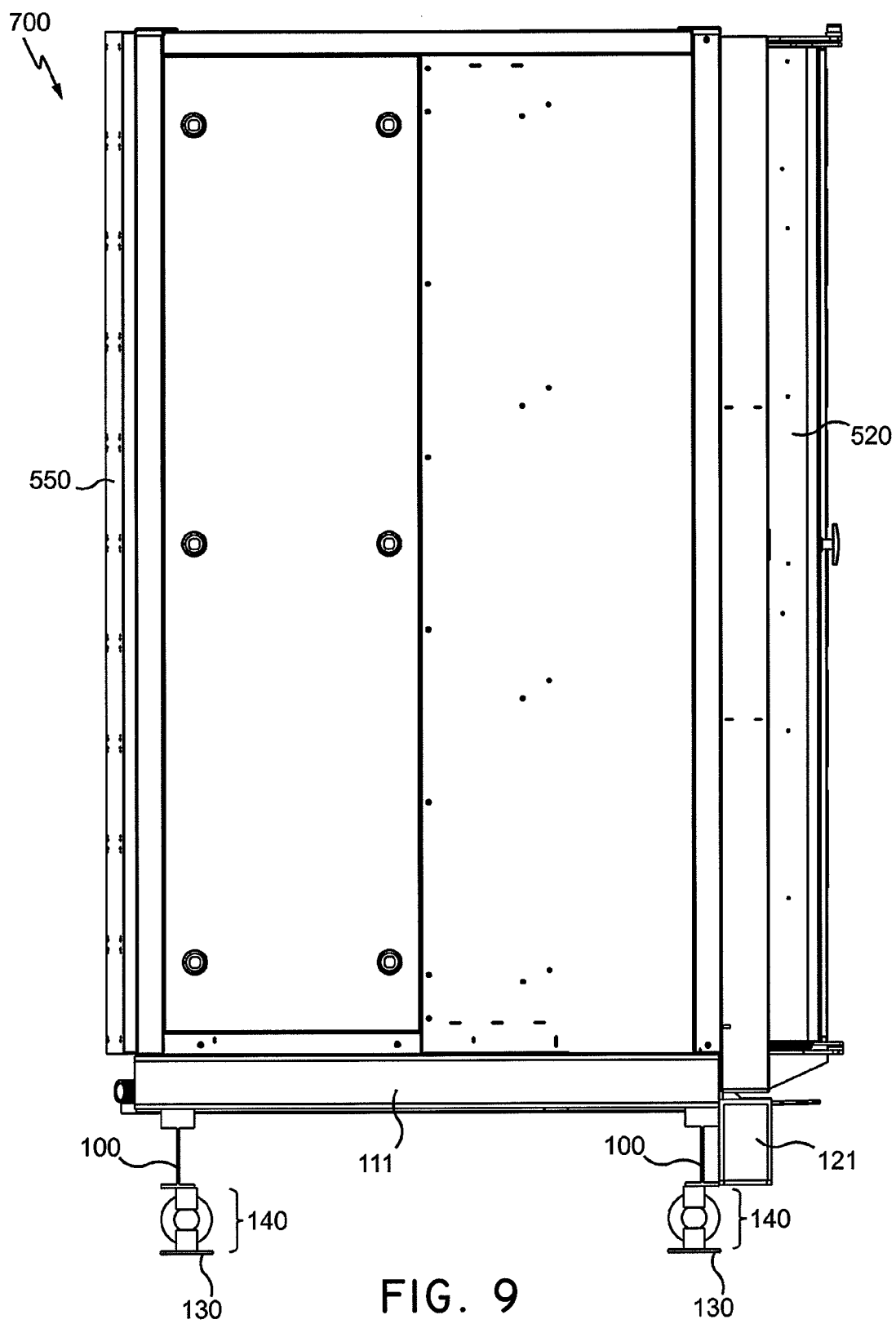

FIG. 9 represents the same IT apparatus 700 also seen from the side but here, from the back of the IT apparatus 700 represented in FIG. 7. The secondary doors 520 can be recognized whose door frame is in contact with the added-on parts 121, serving as door support, which is also the case for the added-on parts 120.

Figure 10:
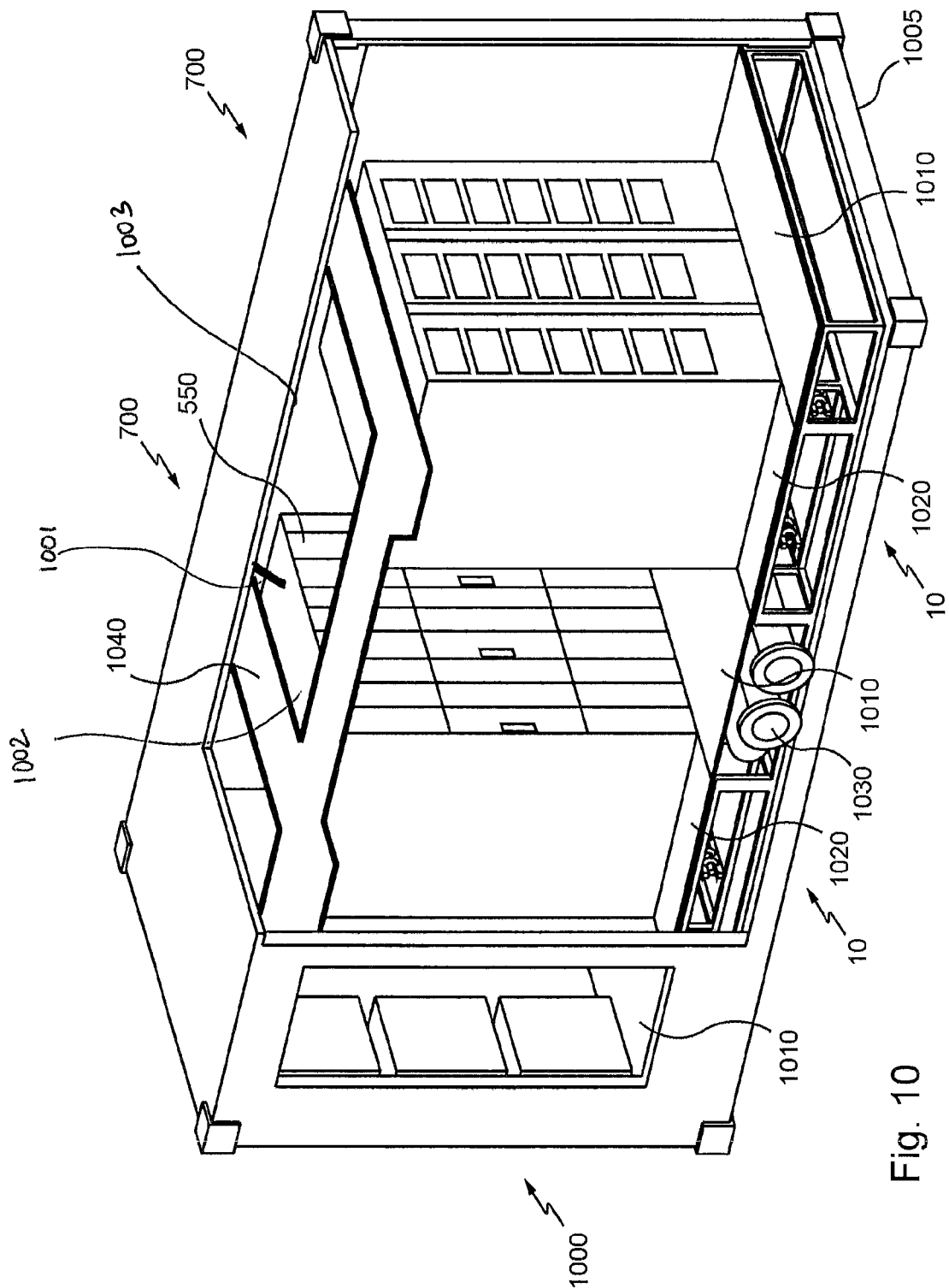

In FIG. 10, there has been represented a container 1000 for a transportable IT hosting center incorporating two IT apparatuses 700 such as the one represented in FIGS. 7 to 9.

The container 1000 comprises a horizontal lower wall 1005 to which are bolted the lower fastening plates 130 of the shock-absorbing device 10 of each of the IT apparatuses 700. The lower wall 1005 is liable to vibrate, in particular vertically, during the transport of the container, or if the container is disposed in a zone subject to strong shaking, like an off-shore platform.

The two IT apparatuses 700 are disposed parallel to each other, the main doors 550 of the IT racks of the first IT apparatus facing the main doors 550 of the IT racks of the second IT apparatus. Thus the two IT apparatuses 700 are disposed head-to-tail.

The rows of IT racks are disposed parallel to the front doors of the container (one of which is hidden on the left of the Figure, and the other is not represented on the right of the Figure, which is shown cut away for part of the container so as to make the inside thereof visible), and thus perpendicularly to the longitudinal axis thereof. It can furthermore be noted that the two rows of cases are in contact with the same lateral wall of the container (at the back of the Figure).

A transverse access deck 1010 forming a floor for the container is disposed between the two IT apparatuses 700. Within the thickness of that access deck, hydraulic pipes 1030 are present, which serve to supply the cooling systems of the IT racks. These hydraulic pipes 1030 include a supply of cold water and a supply of hot water. Transverse access decks 1010 forming a floor for the container are also disposed in front of the faces comprising the secondary doors of the IT apparatuses 700.

A longitudinal technical deck 1020 is also present along one of the longitudinal vertical walls of the container 1000. It also forms a floor for the inside of the container.

Thus, a human operator may move within the container 1000 by walking on the transverse access decks 1010 and the longitudinal access decks 1020, and access the front and the back of the IT racks without leaving the container.

It is noted that neither the longitudinal access decks 1020, nor the transverse access decks 1010 have a shock-absorbing system here. They are rigidly fastened neither to the IT racks nor to the shock-absorbing system 10, which is thus specific to each of the IT apparatuses 700. Thus, when the container is induced to vibrate, the access decks may vibrate independently of the IT racks, the latter having a damped movement enabling the electronic components they contain to be protected. In a particular embodiment, the access decks 1010 and 1020 are rigidly fastened to the lower surface 1005 of the container.

When the container 1000 is transported or when it undergoes shaking on account of a harsh environment, the shock-absorbing units in addition give non-linear damping and preserve the electronic components contained in the IT racks.

It is to be noted that the container 1000 also preferably comprises a cable 1001 linking the top 1002 of each IT apparatus 700 to the ceiling 1003 of the container 1000. This cable 1001 enables the cases to be kept in vertical position in case of a strong shock in the longitudinal direction of the container.

Figure 11A:
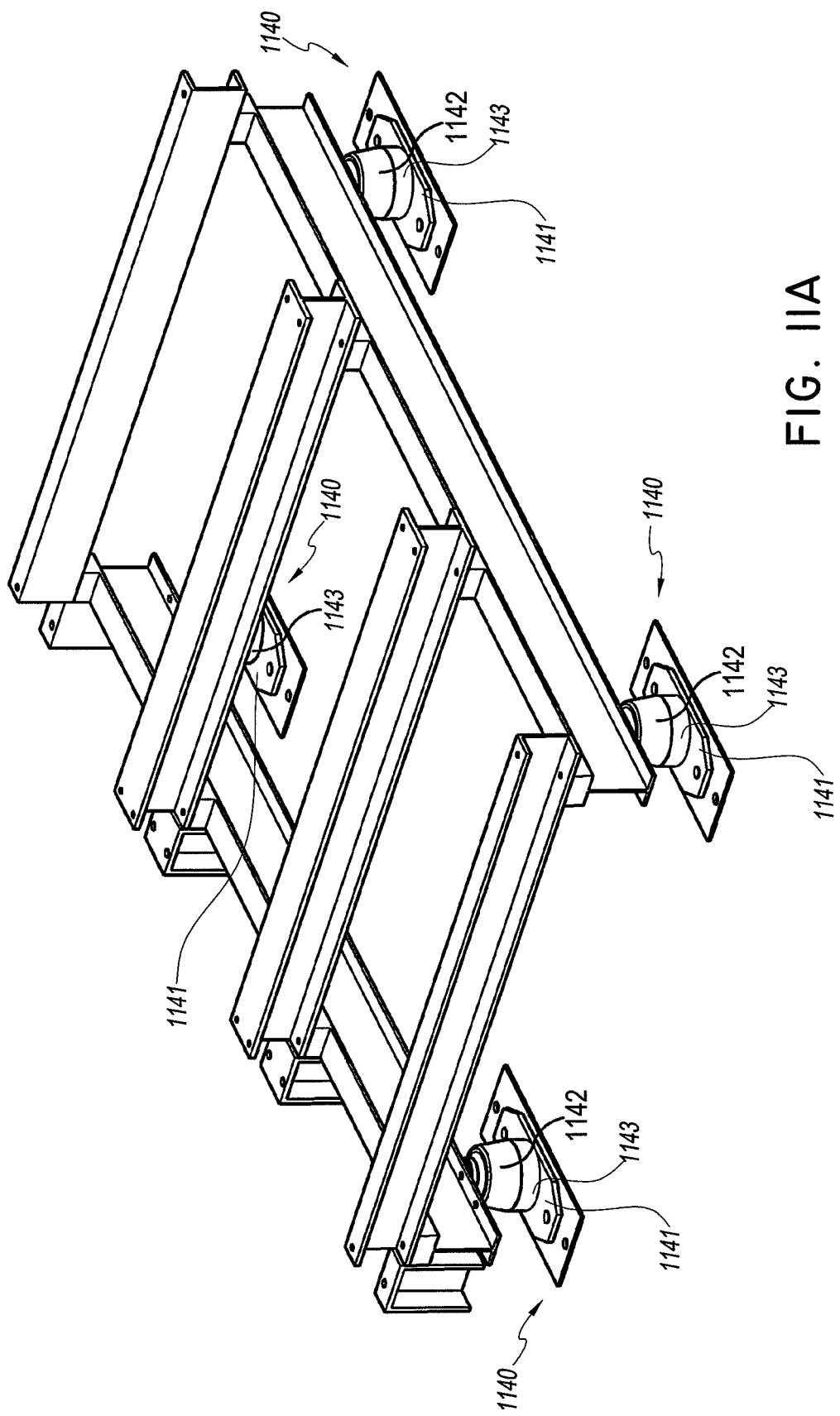
FIG. 11A illustrates a second shock-absorbing device according to the invention, viewed in perspective.

By way of illustration, FIG. 11A represents a second shock-absorbing device according to the invention, viewed in perspective. The device represented in FIG. 11A is similar to that represented in FIG. 1, however, the four shock-absorbing units are here of Silentbloc type, referenced 1140, comprising two rigid supports 1141 and 1142 separated from each other and held together by an elastic material 1143.

Figure 11B:
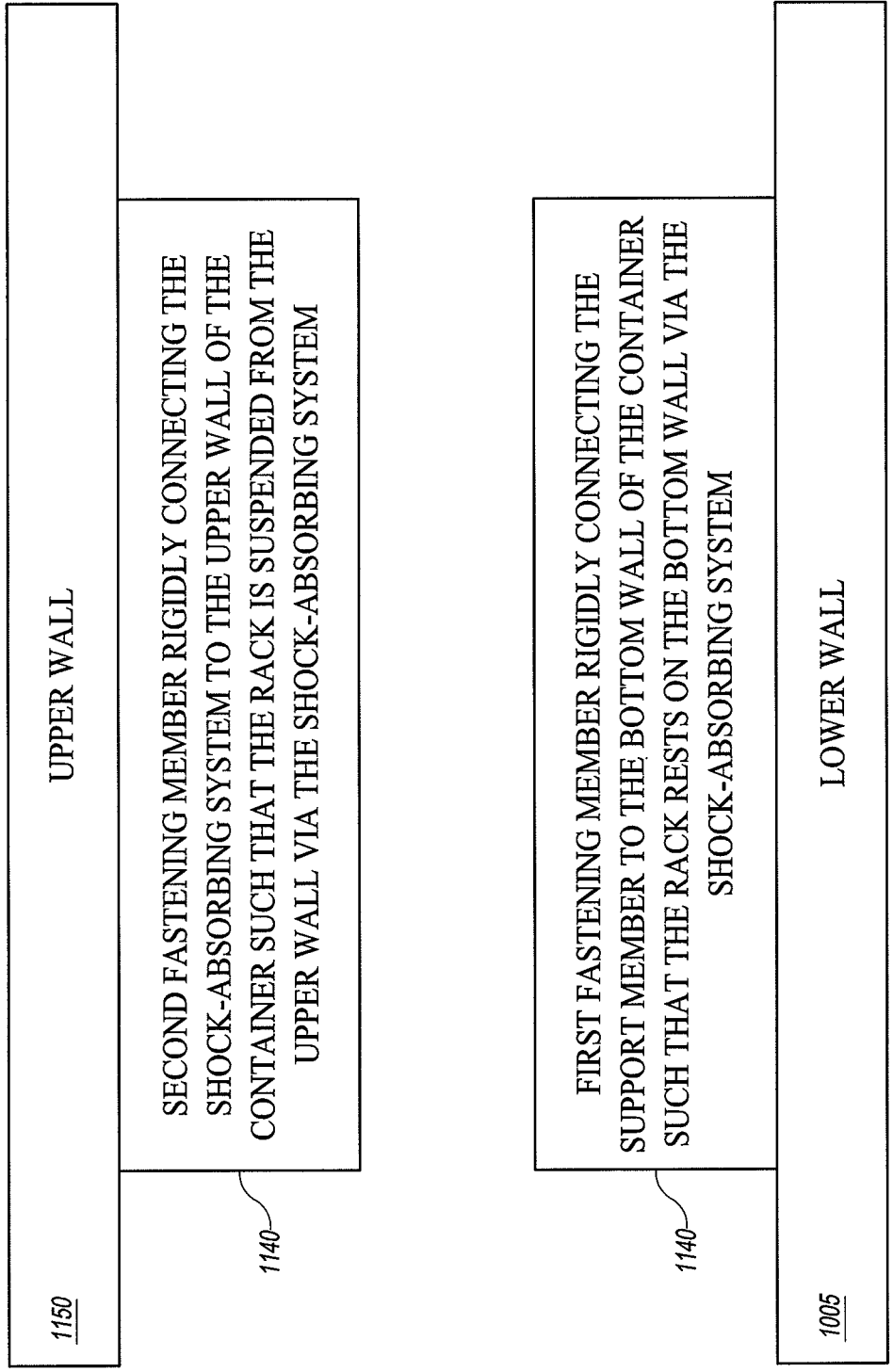
FIG. 11B illustrates a second shock-absorbing device fastened to a lower or bottom wall and to an upper wall of the container, viewed in perspective.

According to an alternative embodiment, as shown by illustration in FIG. 11B, the container 1000 for a transportable IT hosting center incorporating two IT apparatuses 700 such as the one represented in FIG. 10 has a shock-absorbing system comprising a fastening member adapted to be fastened, for example rigidly, to the upper wall 1150 of the container 1000. This is also liable to vibrate, in particular vertically, during the transport or if the container 1000 is placed in a zone with strong shaking such as an off-shore platform. The IT racks are thus suspended from the ceiling via a shock-absorbing system similar to those presented above in FIG. 11A, including shock-absorbing units 1140. However, whereas these shock-absorbing units work in compression in the embodiment described earlier, they operate in tension here. Further, the example illustrates shock-absorbing units of the Silentbloc type, but they could alternatively be of other suitable types, such as the shock-absorbers of Vibcable type previously described.

The manner of preparing such a container 1000 will now be specified. Initially the container 1000 is empty.

A first step consists of determining the number of IT apparatuses 700 desired by the future user of the hosting center who ordered the container 1000, knowing that an IT apparatus 700 here contains three IT racks of predetermined size, which may be a standard size. It is observed that according to other embodiments, an IT apparatus may contain one or two IT racks or more.

A second step consists of installing a transverse access deck 1010 near one of the front doors of the container (referred to as back door during the loading and which may be closed during that time) and possibly of fastening it rigidly to the lower wall.

Next, during a third step, an IT apparatus 700 such as presented in FIG. 7 is disposed at the back of the container 1000 along the first transverse access deck 1010 and thus transversely relative to the longitudinal axis of the container 1000. The IT apparatus 700 may be provided using a light handling apparatus such as a pallet jack, taking advantage of the handling zone 160. The light handling apparatus here enters by the open front door (remote from the back door), deposits the IT apparatus 700 and leaves the container again by the same open front door.

The plates 130 are advantageously bolted to the lower wall 1005 of the container. A first longitudinal access deck 1020 is next put in place as well as a second transverse access deck 1010, possibly by bolting them to the lower wall 1005. Hydraulic pipes and electrical cables are fitted within the thickness of those access decks to supply the IT racks of the IT apparatus 700 for example by the lower parts 530 thereof.

Next, still using a light handling apparatus and by the open front door, a second IT apparatus 700 is brought, including like the previous one its own shock-absorbing system. It is disposed parallel to the first, preferably head-to-tail in relation thereto, against the same lateral wall. Alternatively, it is possible for it not to be disposed head-to-tail. It could also be disposed against the other lateral wall.

These operations are reiterated the desired number of times depending on the IT power required. Longitudinal and lateral access decks are disposed around the rows of IT racks, in order for an operator to be able to stand up in front of the IT racks at a height enabling him to operate inside them.

The method of preparing the container may also be implemented without any light handling apparatus, the IT racks, provided with their integrated shock-absorbing units being transported and put in place by human operators. In this case, the presence of a handling surface 160 is not necessary.

Furthermore, this handling surface, when present, may take different forms, the essential being for a specifically dedicated handling apparatus, dedicated and prepared or otherwise available, to be able to transport the IT apparatus 700 from outside the container to the inside thereof.

The container 1000 may next be transported by truck or by ship or also be installed in a zone with strong vibrations such as an off-shore zone. The installed IT apparatuses 700 are all protected thanks to their incorporated shock-absorbing system.

The invention is not limited to the described embodiments, but covers all the variants within the capability of the person skilled in the art.

The invention claimed is:

1. An information technology (IT) apparatus for a portable IT hosting center, the apparatus comprising:
at least one rack having at least one IT device;
a shock-absorbing system dampening vibrations transmitted to the rack, wherein the shock-absorbing system comprises at least one shock-absorbing unit and at least one support member, the at least one support member having a first fastening member rigidly connecting the support member to a bottom wall of a container, such that the rack rests on the bottom wall via the shock-absorbing system, wherein the IT apparatus is dimensioned and arranged to be movable inside the container for the IT apparatus to be put into place, and wherein the shock-absorbing system comprises a second fastening member, distinct from the first fastening member, rigidly connecting the shock-absorbing system to an upper wall of the container, the upper wall being opposite to the bottom wall, such that the rack is suspended from the upper wall via the shock-absorbing system, and
a first and a second horizontal beam for supporting a bottom side of the rack, each of the first and the second horizontal beam having a portion thereof positioned underneath the bottom side of the rack, the first horizontal beam supporting the second horizontal beam and arranged between the second horizontal beam and the at least one shock-absorbing unit so that the at least one shock-absorbing unit is provided underneath the first horizontal beam to support the first and the second horizontal beam.

2. The apparatus according to claim 1, comprising a continuous or discontinuous handling surface directly accessible under the rack.

3. The apparatus according to claim 1, wherein the shock-absorbing system comprises four shock-absorbing units, which are disposed in a rectangular configuration.

4. The apparatus according to claim 1, comprising a plurality of racks, configured in a row.

5. The apparatus according to claim 4, wherein the plurality of racks are fastened together at the upper wall and/or the bottom wall.

6. The apparatus according to claim 1, wherein the rack and the shock-absorbing unit are fastened respectively to the second and the first horizontal beam.

7. The apparatus according to claim 1, wherein the shock-absorbing system comprises at least one shock-absorbing unit comprising an elastic material.

8. A container for a transportable information technology (IT) hosting center, the container comprising at least one IT apparatus, wherein the at least one IT apparatus comprises:
at least one rack having at least one IT device;
a shock-absorbing system dampening vibrations transmitted to the rack from the container, wherein the shock-absorbing system comprises at least one shock-absorbing unit and at least one support member, the at least one support member having a first fastening member rigidly connecting the support member to a bottom wall of the container, such that the rack rests on the bottom wall via the shock-absorbing system, wherein the IT apparatus is dimensioned and arranged to be movable inside the container for the IT apparatus to be put into place, and wherein the shock-absorbing system comprises a second fastening member, distinct from the first fastening member, rigidly connecting the shock-absorbing system to an upper wall of the container, the upper wall being opposite to the bottom wall, such that the rack is suspended from the upper wall via the shock-absorbing system, and
a first and a second horizontal beam for supporting a bottom side of the rack, each of the first and the second horizontal beam having a portion thereof positioned underneath the bottom side of the rack, the first horizontal beam supporting the second horizontal beam and arranged between the second horizontal beam and the at least one shock-absorbing unit so that the at least one shock-absorbing unit is provided underneath the first horizontal beam to support the first and the second horizontal beam.

9. The container according to claim 8, further comprising an access deck in front of a door of the rack, wherein the access deck vibrates independently of the rack.

10. The container according to claim 9, wherein the access deck is rigidly fastened to the container.

11. The container according to claim 8, further comprising a second IT apparatus, wherein the second apparatus comprises:
- at least one second rack; and
- a second shock-absorbing system dampening vibrations transmitted to the at least one second rack from the container, wherein the second shock-absorbing system is independent of the shock-absorbing system of the at least one apparatus.

12. The container according to claim 8, further comprising a cable linking the at least one IT apparatus to a wall of the container.

13. The apparatus according to claim 1, wherein the shock-absorbing system comprises at least one shock-absorbing unit comprising two rigid supports separated from each other and held together by an elastic material.

14. The container according to claim 8, wherein the shock-absorbing system comprises at least one shock-absorbing unit comprising two rigid supports separated from each other and held together by an elastic material.

15. The apparatus according to claim 1, wherein the shock-absorbing system comprises at least one shock-absorbing unit fastened to the upper wall of the container, and wherein the at least one shock-absorbing unit operates in tension.

16. The apparatus according to claim 1, wherein the second horizontal beam is transverse to the first horizontal beam.

17. The apparatus according to claim 1, wherein the rack is fastened to the second horizontal beam.

18. The apparatus according to claim 1, comprising a third horizontal beam parallel to the second horizontal beam and supporting the bottom side of the rack, wherein the first horizontal beam supports the third horizontal beam and wherein the rack is fastened to both the second and the third horizontal beams.

19. The container according to claim 8, wherein the second horizontal beam is transverse to the first horizontal beam.

20. The container according to claim 8, wherein the rack is fastened to the second horizontal beam.

21. The container according to claim 8, comprising a third horizontal beam parallel to the second horizontal beam and supporting the bottom side of the rack, wherein the first horizontal beam supports the third horizontal beam and wherein the rack is fastened to both the second and the third horizontal beams.

22. An information technology (IT) apparatus for a portable IT hosting center, the apparatus comprising:
- at least one rack having at least one IT device;
- a shock-absorbing system dampening vibrations transmitted to the rack, wherein the shock-absorbing system comprises at least one shock-absorbing unit and at least one support member, the at least one support member having a first fastening member for rigidly connecting the support member to a bottom wall of a container, such that the rack rests on the bottom wall via the shock-absorbing system, wherein the IT apparatus is dimensioned and arranged to be movable inside the container for the IT apparatus to be put into place, and
- a first, a second and a third horizontal beam for supporting a bottom side of the rack, each of the first, the second and the third horizontal beam having a portion thereof positioned underneath the bottom side of the rack, the first horizontal beam supporting the second and the third horizontal beam and arranged between the second horizontal beam and the at least one shock-absorbing unit so that the at least one shock-absorbing unit is provided underneath the first horizontal beam to support the first and the second horizontal beam
- wherein the third horizontal beam is parallel to the second horizontal beam, and
- wherein the bottom side of the rack includes a first and a second lower part, the first lower part being fastened to the second and the third horizontal beam and the second lower part provided below the first lower part so that the second lower part is arranged between the first and the second horizontal beams.

23. The apparatus according to claim 22, wherein the second and the third horizontal beam are transverse to the first horizontal beam.

24. The apparatus according to claim 18, wherein the bottom side of the rack includes a first and a second lower part, the first lower part being fastened to the second and the third horizontal beam and the second lower part provided below the first lower part so that the second lower part is arranged between the first and the second horizontal beams.

25. The container according to claim 21, wherein the bottom side of the rack includes a first and a second lower part, the first lower part being fastened to the second and the third horizontal beam and the second lower part provided below the first lower part so that the second lower part is arranged between the first and the second horizontal beams.

* * * * *